(12) United States Patent
Tsai et al.

(10) Patent No.: US 9,312,365 B2
(45) Date of Patent: Apr. 12, 2016

(54) MANUFACTURING METHOD OF NON-PLANAR FET

(71) Applicant: UNITED MICROELECTRONICS CORP., Hsin-Chu (TW)

(72) Inventors: Shih-Hung Tsai, Tainan (TW); Ssu-I Fu, Kaohsiung (TW); Ying-Tsung Chen, Kaohsiung (TW); Chih-Wei Chen, Taiching (TW); Ying-Chih Lin, Tainan (TW); Chien-Ting Lin, Hsinchu (TW); Hsuan-Hsu Chen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/487,103

(22) Filed: Sep. 16, 2014

(65) Prior Publication Data

US 2015/0004766 A1    Jan. 1, 2015

Related U.S. Application Data

(62) Division of application No. 13/562,322, filed on Jul. 31, 2012, now Pat. No. 8,872,280.

(51) Int. Cl.
| | |
|---|---|
| *H01L 21/336* | (2006.01) |
| *H01L 29/66* | (2006.01) |
| *H01L 29/78* | (2006.01) |
| *H01L 29/51* | (2006.01) |

(52) U.S. Cl.
CPC .......... *H01L 29/66795* (2013.01); *H01L 29/51* (2013.01); *H01L 29/66818* (2013.01); *H01L 29/785* (2013.01)

(58) Field of Classification Search
CPC ............... H01L 21/7621; H01L 21/823431
USPC ............................... 438/284, 426, 437
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,921,963 B2 | 7/2005 | Krivokapic | |
| 7,087,477 B2 | 8/2006 | Fried | |
| 7,091,551 B1 | 8/2006 | Anderson | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,465,642 B2 | 12/2008 | Cheng | |
| 7,470,570 B2 | 12/2008 | Beintner | |
| 7,531,437 B2 | 5/2009 | Brask | |
| 7,569,857 B2 | 8/2009 | Simon | |
| 7,833,887 B2 | 11/2010 | Rachmady | |
| 8,263,462 B2 * | 9/2012 | Hung | ............ H01L 29/785 257/288 |
| 2004/0195624 A1 | 10/2004 | Liu | |
| 2005/0051825 A1 | 3/2005 | Fujiwara | |
| 2006/0099830 A1 | 5/2006 | Walther | |

(Continued)

*Primary Examiner* — Chandra Chaudhari
(74) *Attorney, Agent, or Firm* — Winston Hsu; Scott Margo

(57) ABSTRACT

The present invention provides a non-planar FET which includes a substrate, a fin structure, a sub spacer, a gate, a dielectric layer and a source/drain region. The fin structure is disposed on the substrate. The sub spacer is disposed only on a middle sidewall of the fin structure. The gate is disposed on the fin structure. The dielectric layer is disposed between the fin structure and the gate. The source/drain region is disposed in the fin structure. The present invention further provides a method of forming the same.

10 Claims, 8 Drawing Sheets

(56) References Cited

U.S. PATENT DOCUMENTS

| | | |
|---|---|---|
| 2006/0286729 A1 | 12/2006 | Kavalieros |
| 2007/0108528 A1 | 5/2007 | Anderson |
| 2007/0158756 A1 | 7/2007 | Dreeskornfeld |
| 2008/0157208 A1 | 7/2008 | Fischer |
| 2009/0124097 A1 | 5/2009 | Cheng |
| 2009/0242964 A1 | 10/2009 | Akil |
| 2009/0269916 A1 | 10/2009 | Kang |
| 2010/0025806 A1 | 2/2010 | Cho |
| 2010/0048027 A1 | 2/2010 | Cheng |
| 2010/0072553 A1 | 3/2010 | Xu |
| 2010/0144121 A1 | 6/2010 | Chang |
| 2010/0167506 A1 | 7/2010 | Lin |

* cited by examiner

US 9,312,365 B2

MANUFACTURING METHOD OF NON-PLANAR FET

CROSS REFERENCE TO RELATED APPLICATIONS

This application is a Divisional of application Ser. No. 13/562,322 filed Jul. 31, 2012, and included herein by reference.

BACKGROUND OF THE INVENTION

1. Field of the Invention

The present invention relates to a non-planar FET and a manufacturing method thereof, and more particularly to a non-planar FET which includes a sub spacer only on a middle sidewall of the fin structure and a manufacturing method thereof.

2. Description of the Prior Art

In recent years, as various kinds of consumer electronic products have been constantly developed towards miniaturization and the size of semiconductor components has reduced accordingly, in order to meet requirements of high integration, high performances, and low power consumption for the products.

However, with the miniaturization of the electronic products, current planar transistors no longer meet these requirements. Non-planar transistors, such as fin field effect transistors (Fin-FET), have been therefore introduced to reach a high drive current and to lower short channel effects. However, due to the three-dimensional structure of the Fin-FETs, a lot of drawbacks raise as well. For example, the height of the fin structure, which corresponds to the channel width, is hard to control due to the use of HF in the etching process when patterning the substrate to form the fin structure. The quality of the Fin-FET is therefore affected.

Consequently, there is still a need for a novel FET structure and a method of making the same in order to improve the performances of the devices.

SUMMARY OF THE INVENTION

The present invention provides a non-planar FET and a manufacturing method thereof, in which the non-planar FET includes a sub spacer only on a middle sidewall of the fin structure.

According to one embodiment, the non-planar FET in the present invention includes a substrate, a fin structure, a sub spacer, a gate, a dielectric layer and a source/drain region. The fin structure is disposed on the substrate. The sub spacer is disposed only on a middle sidewall of the fin structure. The gate is disposed on the fin structure. The dielectric layer is disposed between the fin structure and the gate. The source/drain region is disposed in the fin structure.

According to another embodiment, a method of forming a non-planar FET is provided. First, a substrate is provided. A plurality of fin structures and a plurality of sub-spacer disposed only on a middle sidewall of the fin structure are formed on the substrate. Then, a gate is formed on the fin structure. Finally, a source/drain region is formed in the fin structure.

The present invention provides a sub spacer that is formed only on the middle sidewall of the fin structure. In one embodiment, the sub spacer is formed in the concave part of the fin structure. In another embodiment, the sub spacer stretches outwardly from the fin structure and forms a wing-like structure. Compared to conventional methods, the position of the sub spacer in the present invention can be well controlled, so that the channel length of the non-planar FET in the present invention can also be well controlled, thereby improving the performance of the device.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be detailed. The preferred embodiments of the present invention are illustrated in the accompanying drawings with numbered elements.

Figure 1:
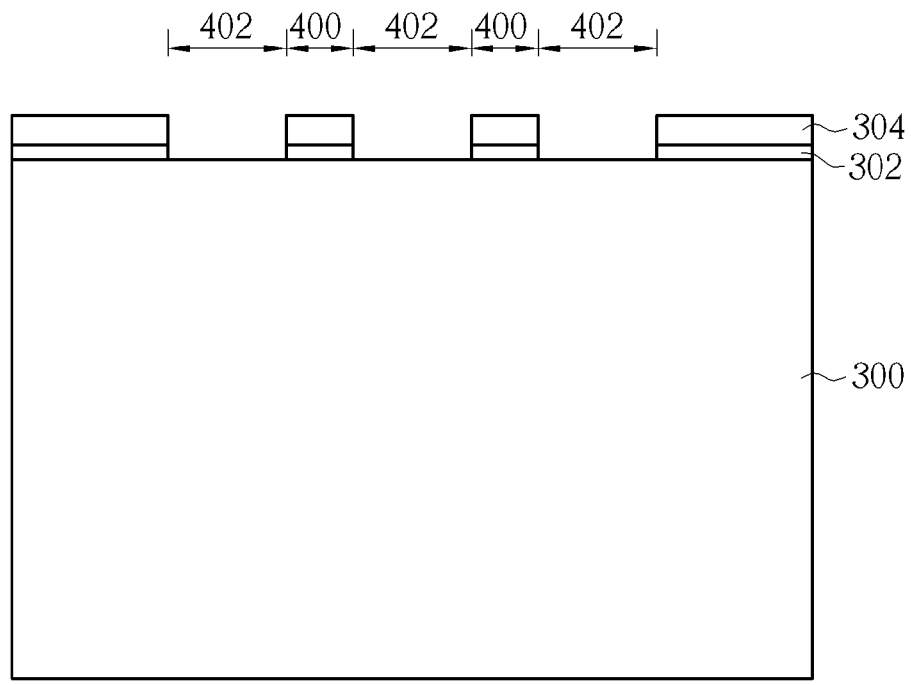
FIG. 1 to FIG. 10 are schematic diagrams of the method of manufacturing the non-planar FET of the present invention.

Please refer to FIG. 1 to FIG. 10, which are schematic diagrams of the method of manufacturing the non-planar-FET in the present invention. As shown in FIG. 1, a substrate 300 is provided. The substrate 300 may include a silicon substrate, an epitaxial silicon substrate, a silicon germanium substrate, or a silicon carbide substrate, but is not limited thereto. A plurality of active regions 400 and an isolation region 402 are defined on the substrate 300. The active regions 400 are encompassed by the isolation regions 402. In the subsequent steps, at least a non-planar FET will be formed in the active region 400 while a shallow trench isolation (STI) is formed in the isolation region 402. It is worth noting that the present embodiment shows two active regions 400 that are encompassed by the isolation regions 402. In another embodiment, only one active region 400 is encompassed by the isolation region 402. In another embodiment, more than two active regions 400 are encompassed by the isolation regions 402. An optional patterned liner layer 302 and a patterned mask layer 304 are formed on the substrate 300. The patterned liner layer 302 and the patterned mask layer 304 are formed on the substrate 300 in the active regions 400, but are not formed on the substrate 300 in the isolation region 402. In one embodiment, the patterned liner layer 302 may include $SiO_2$, and the patterned mask layer 304 may include SiN. In another embodiment, the patterned mask layer 304 can include other materials suitable for a use in a hard mask, such as silicon carbide (SiC), silicon oxynitride (SiON) or an advanced pattern film (APF) provided by the Applied Material Corporation, or a combination thereof.

Figure 2:
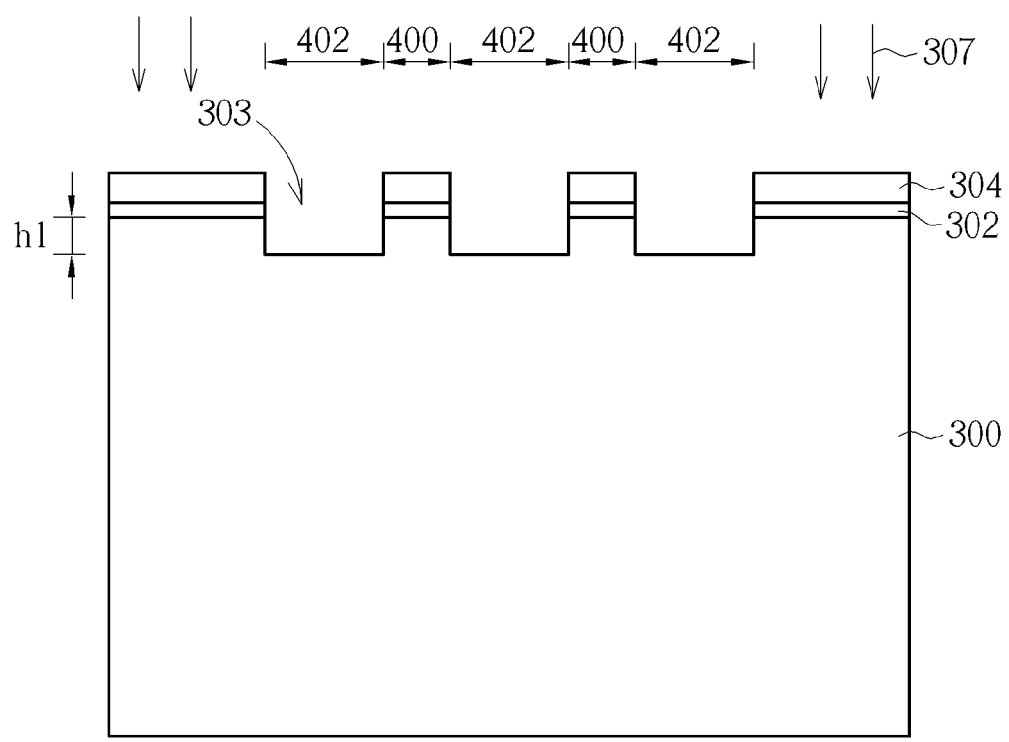

As shown in FIG. 2, a first etching process 307 is performed by using the patterned hard mask layer 304 as a mask to form a plurality of first trenches 303 in the isolation region 402. In one embodiment, the first trench 303 has a depth h1 comprised between 200 angstroms to 300 angstroms, but is not limited thereto. In one embodiment, the first etching process 307 is an anisotropic etching process, such as a dry etching process.

Figure 3:
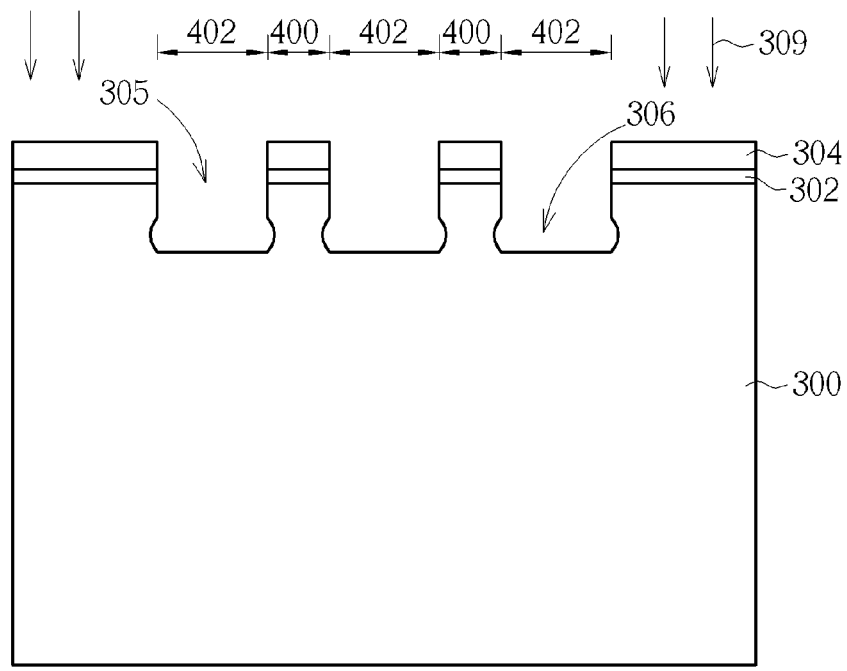
Figure 4:
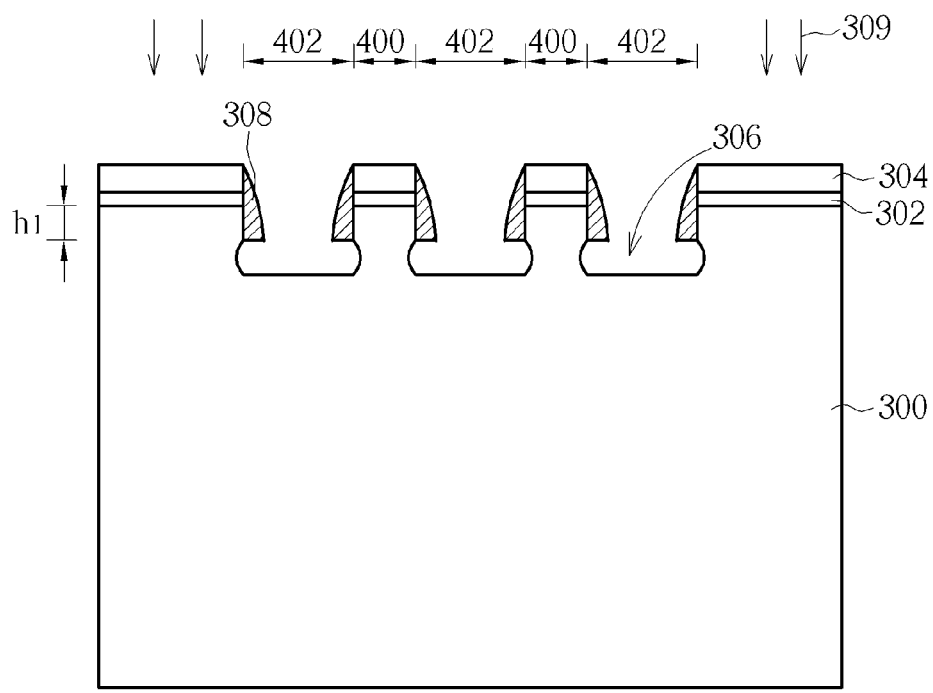

As shown in FIG. 3, a second etching process 309 is carried out to further remove the substrate 300 in the isolation region 402 and a part of the substrate 300 in the active region 400 to form a plurality of second trenches 305. A concave portion 306 is therefore formed at the corner of the sidewall and the bottom surface of the second trench 305. It is worth noting that the concave portion 306 is preferably located deeper than the depth h1. In one embodiment, the second etching process 309 is an anisotropic etching process, such as a dry etching process using an etching recipe different form that of the first etching process 307. In another example, as shown in FIG. 4, the second etching process 309 may be an isotropic etching process such as a wet etching process in which a spacer 308 is formed on the sidewall of the first trench 303 so that the concave structure 306 can be formed in the substrate 300 that is not covered by the spacer 308.

Figure 5:
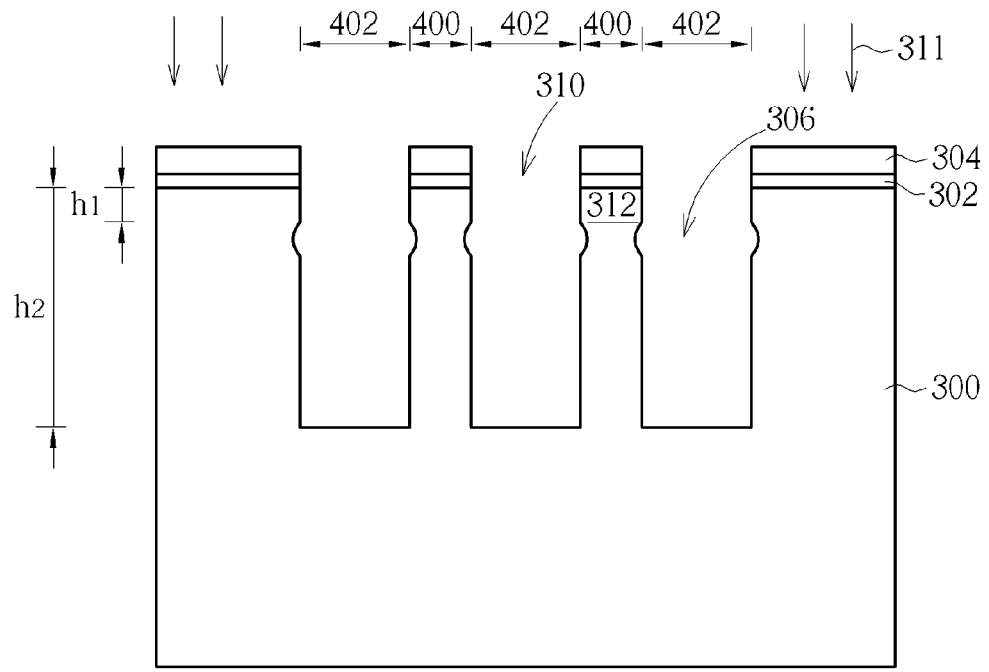

As shown in FIG. 5, a third etching process 311 is performed to further remove the substrate 300 in the isolation region 402 so that the second trenches 305 become a plurality of third trenches 310 having a depth h2, which comprised between 2000 angstroms to 3000 angstroms. The third etching process 311 can, for example, be an anisotropic etching process, such as a dry etching process using the same recipe as the one in the first etching process 307. After the third etching process 311, a plurality of fin structures 312 is formed in the active region 400, and each fin structure 312 has a concave portion 306, thereby forming a "calabash-like" structure. It is worth noting that the method of forming the calabash-like fin structure 312 is not limited to the etching steps described in FIG. 3 to FIG. 5 and can be formed by other methods. For example, the calabash-like fin structure 312 can be formed by a plurality of etching steps and/or a laser process, but not limited thereto.

Figure 6:
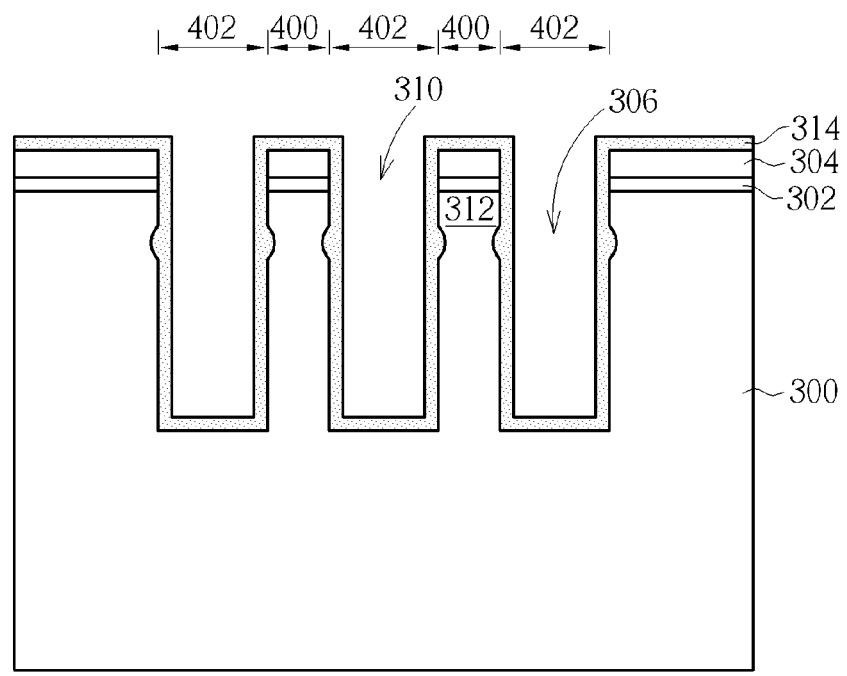

As shown in FIG. 6, a material layer 314 is formed on the substrate 300. Preferably, the material layer 314 is formed conformally along the third trenches 310 and filled into the concaves portions 306. In one embodiment, the material layer 314 is formed through an atomic layer deposition (ALD) process and the material layer 314 is silicon nitride (SiN).

Figure 7:
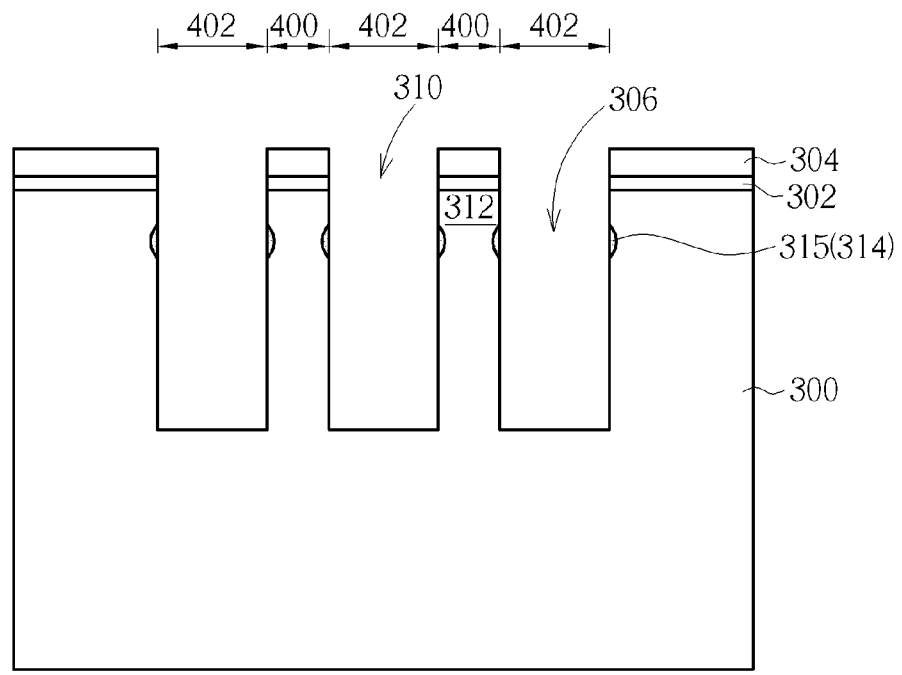

As shown in FIG. 7, an etching process is carried out to remove the material layer 314 in the isolation regions 402 but the material layer 314 in the concave structures 306 is kept. Thus, the material layer 314 in the concave portions 306 becomes a sub spacer 315. The etching process can, for example, be a dry etching process using the patterned mask layer 304 as a mask.

Figure 8:
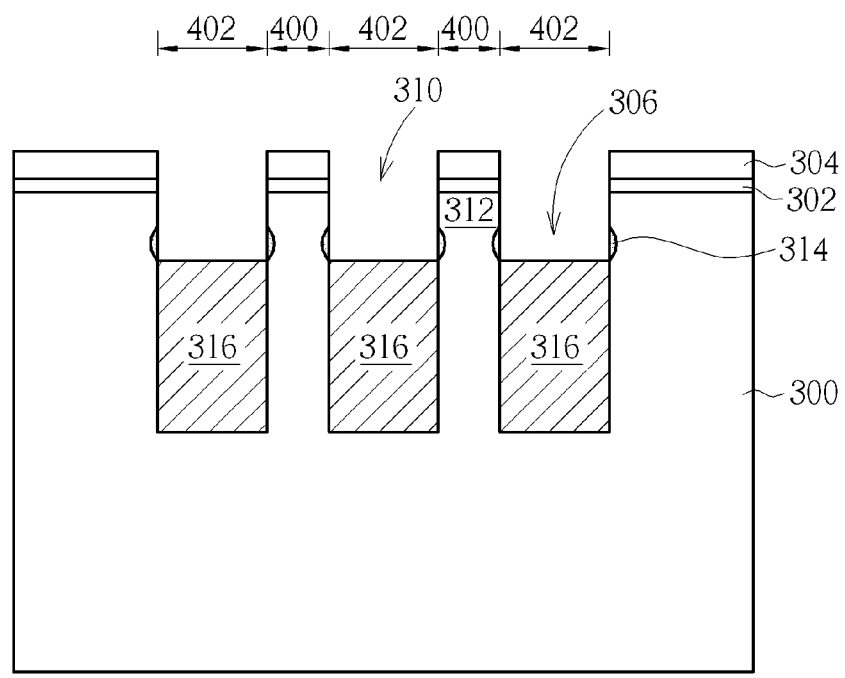

As shown in FIG. 8, a plurality of shallow trench isolations (STI) 316 is formed in the isolation region 402. For example, an insulation layer (not shown) can be formed on the substrate 300 to completely fill the third trenches 310, and then an etching process is carried out to remove the insulation layer outside of the isolation regions 402 and a part of the insulation layer in the isolation regions 402. The insulation layer is preferably removed until the sub spacer 315 is exposed. More preferably, the insulation layer is etched unit its top surface is lower than the sub spacer 315. It is worth noting that the material of the insulation layer, i.e. the STI, has an etching selectivity with respect to the sub spacer 315. In other words, in the etching step for etching the insulation layer, the sub spacer 315 is preferably not etched. In one embodiment, when the sub spacer 315 is SiN, the STI 316 can include silicon oxide ($SiO_2$).

Figure 9:
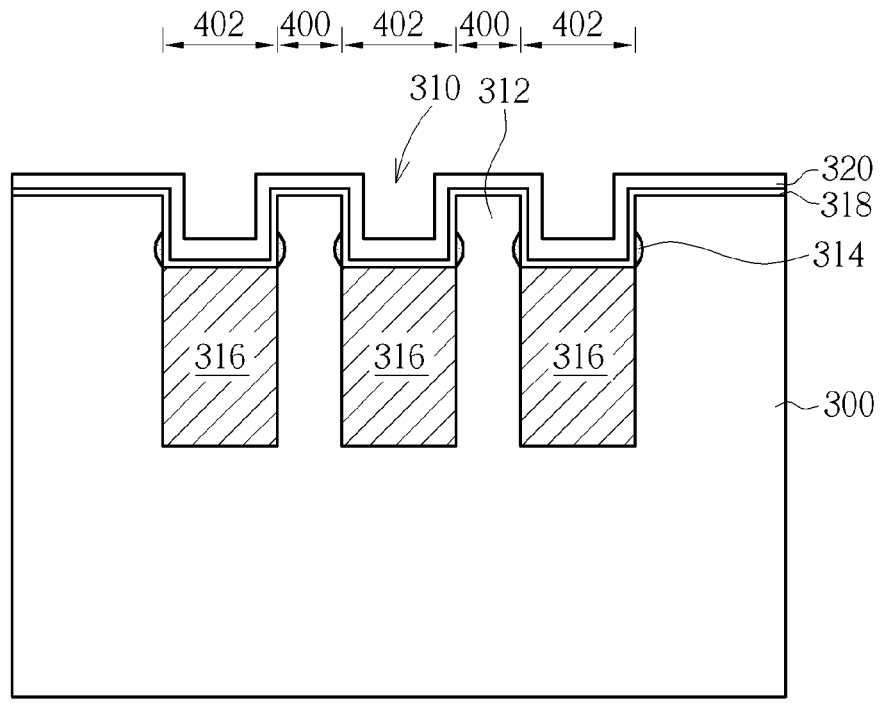
Figure 10:
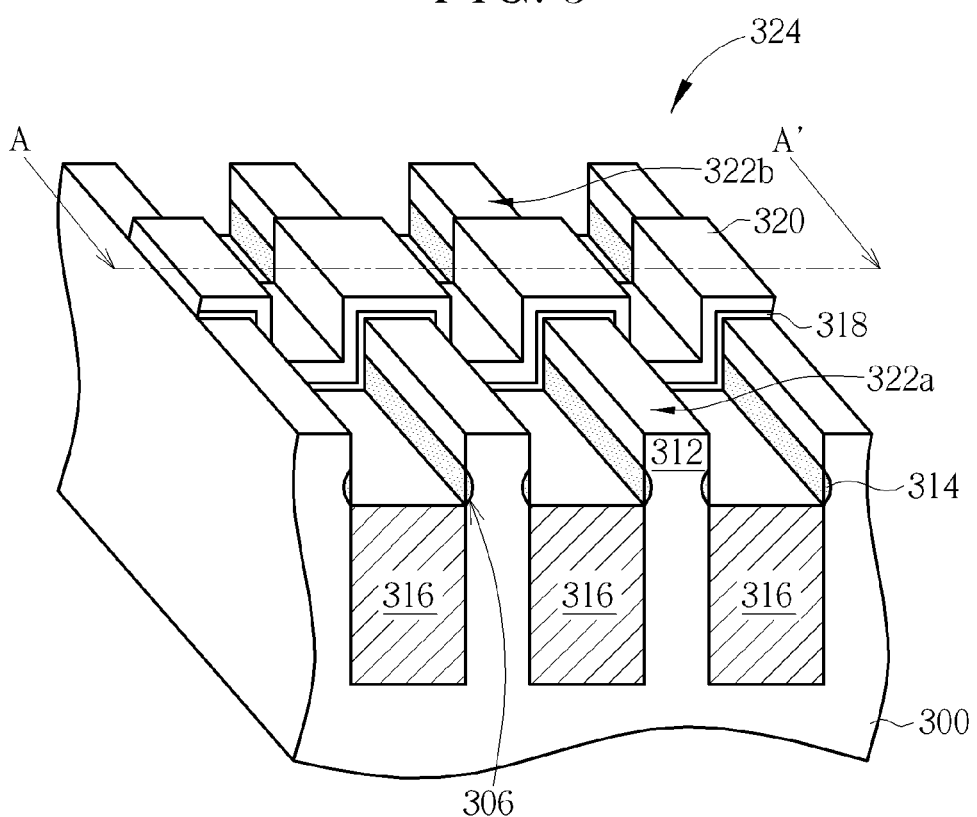
Figure 11:
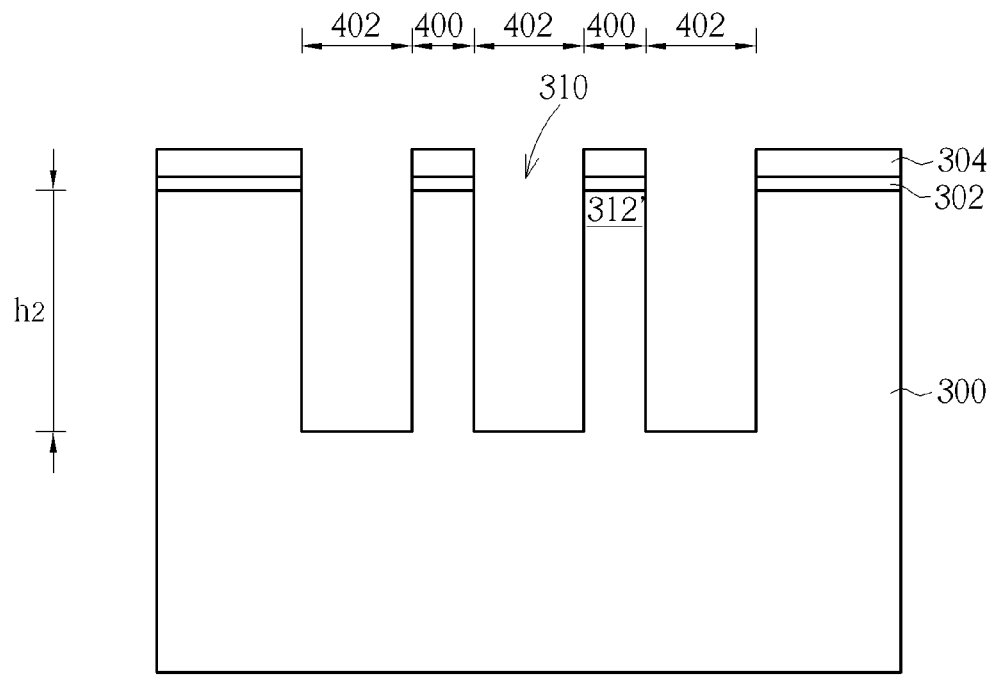
FIG. 11 to FIG. 15 are schematic diagrams of the non-planar FET according to another embodiment in the present invention.

Subsequently, please refer to FIG. 9 and FIG. 10, wherein FIG. 10 shows a three-dimensional view of the method in the present invention and FIG. 9 is a cross-sectional view taken along line A-A'. As shown in FIG. 9 and FIG. 10, the patterned mask layer 304 and the patterned liner layer 302 are removed. In another embodiment, they can be maintained on the substrate 300. Then, a gate dielectric layer 318 is formed on the substrate 300 to cover the calabash-like fin structure 312 which preferably directly contacts the sub spacer 315. In one embodiment, the gate dielectric layer 318 includes SiO2 which is evenly formed on the surface of the fin structure 312 through a thermal oxidation process. In another embodiment, the gate dielectric layer 318 can include other materials such as a high-dielectric material which is formed through an atomic layer deposition (ALD) process. The high-dielectric material has a dielectric index substantially higher than 4, like for example hafnium oxide (HfO2), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta2O_9$, SBT), lead zirconate titanate ($PbZr_xTi_{1-x}O_3$, PZT) and barium strontium titanate ($Ba_xSr_{1-x}TiO_3$, BST), but not limited thereto. Then, a gate layer (not shown) is formed on the gate dielectric layer 318. The gate layer may include various kinds of conductive material such as poly-silicon, metal or salicide. The gate layer is then patterned so that the gate layer becomes a required gate 320 structure. Finally, an ion implant process is performed to form a source region 322a and a drain region 322b in the fin structure 312, as shown in FIG. 10. According to the above steps, a non-planar FET 324 is formed in the active region 400. In another embodiment, an inter-layer dielectric (ILD) layer (not shown) can be further formed on the non-planar FET 324, and a plurality of contact holes (not shown) is formed therein to provide appropriate input/output pathway toward outer circuits.

As shown in FIG. 10, the non-planer FET 324 in the present embodiment includes a substrate 300, a fin structure 312, a sub spacer 315, a gate 320, a dielectric layer 318, and a source/drain region 322a and 322b. The fin structure 312 has a calabash-like structure and has a concave portion 306 in the middle of the sidewall. The sub spacer 315 is filled into the concave portion 306. The STI 316 is preferably lower than the sub spacer 315. In one embodiment, the fin height above the sub spacer 315 is comprised between 200 to 300 angstroms.

Please refer to FIG. 11 to FIG. 15, which are schematic diagrams of the non-planar-FET according to another embodiment in the present invention. In this embodiment, the former step is similar to that in the first embodiment shown in FIG. 1, and the detailed description is omitted. After the step described in FIG. 1, please refer to FIG. 11. An etching process, such as a dry etching process, is carried out by using the patterned mask layer 304 as a mask to form the third trenches 310 in the isolation region. In one embodiment, the third trench 310 has a depth H2 which is comprised between 2000 angstroms to 3000 angstroms, but is not limited thereto. A plurality of fin structure 312' is therefore formed in the active region 400.

Figure 12:
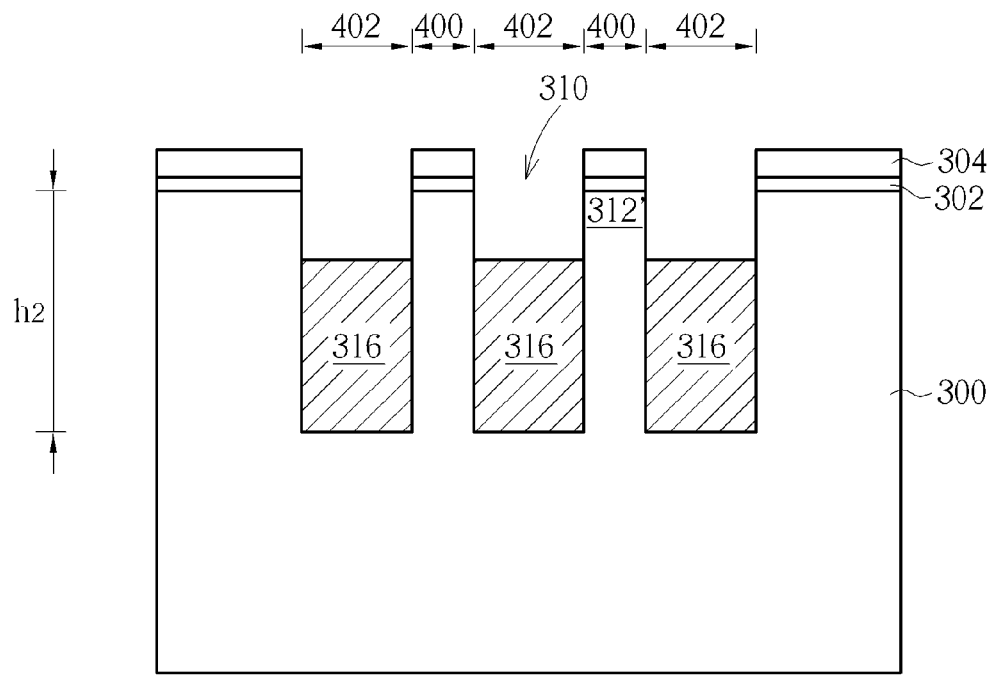
Figure 13:
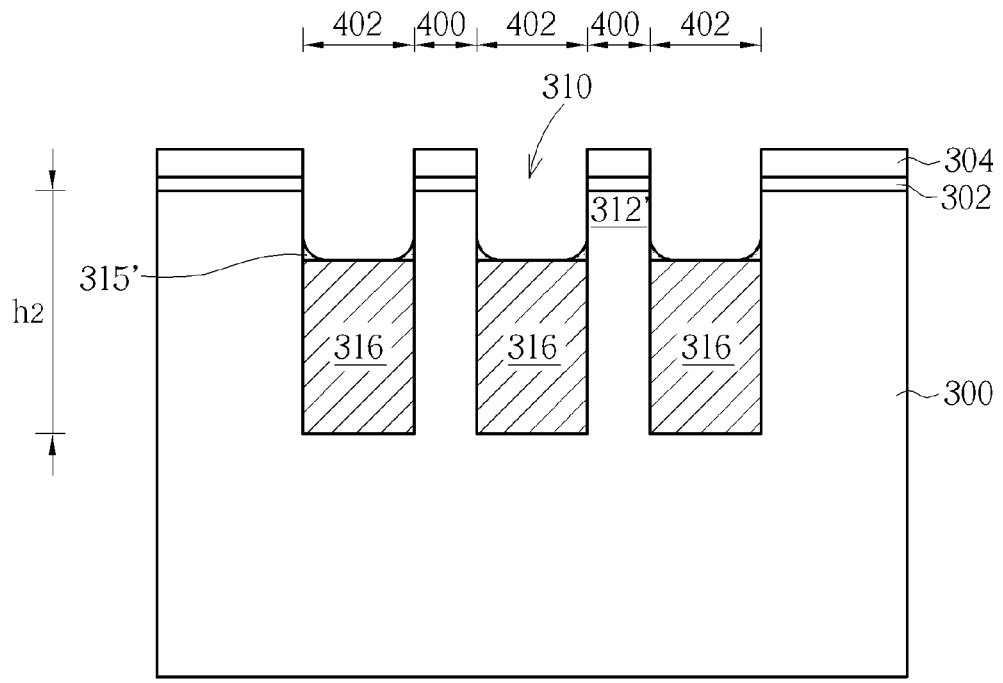

As shown in FIG. 12, a plurality of STI 316 is formed in the isolation region 402. In one embodiment, the material of the STI 316 includes SiO2. Then, as shown in FIG. 13, a plurality of sub spacers 315' is formed at two sides of the fin structures 312. The steps of forming the sub spacers 315' can include: forming a material layer (not shown) on the substrate 300 and then performing a dry etching step to form the sub spacer 315' at the middle portion of the fin structure 312. The material of the sub spacer 315' preferably has an etching selectivity with respect to the STI 316. It is worth noting that the exposed fin structure 312 not covered by the sub spacer 315' has a height h1 comprised between 200 angstroms to 300 angstroms.

Figure 14:
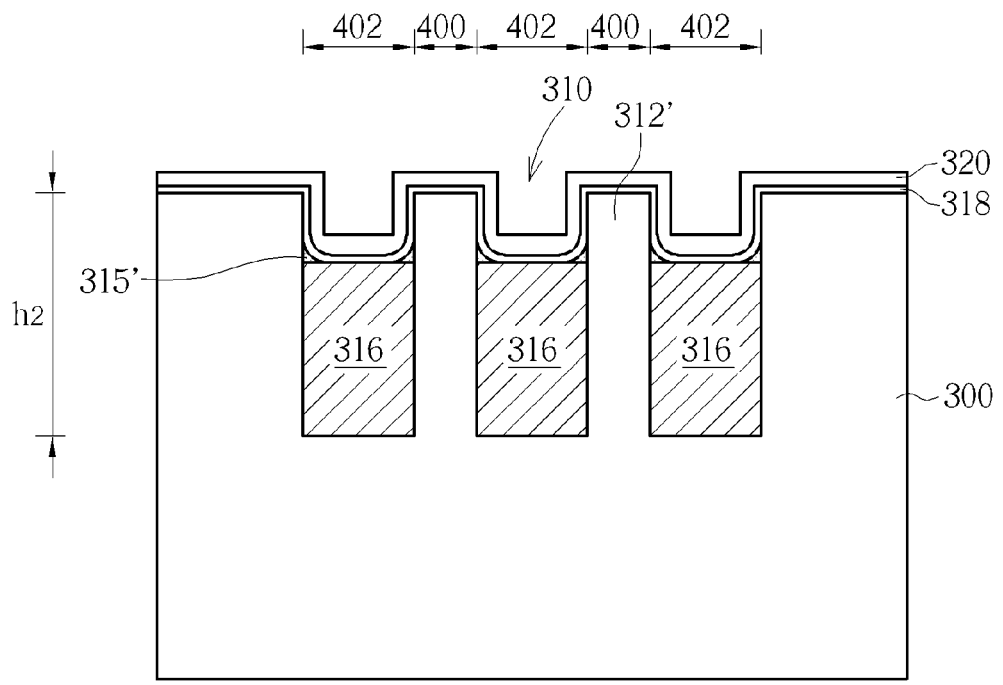
Figure 15:
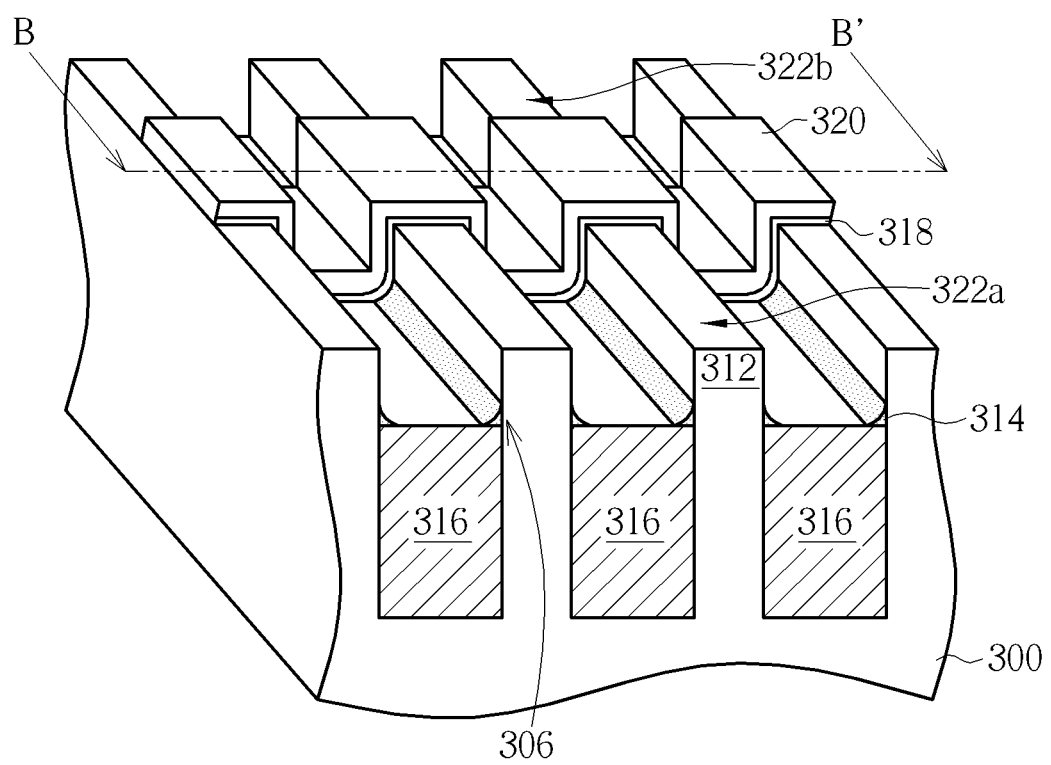

Subsequently, please refer to FIG. 14 and FIG. 15, wherein FIG. 15 shows a three-dimensional view of the method in the present invention and FIG. 14 is a cross-sectional view taken along line B-B'. The patterned mask layer 304 and the patterned liner layer 302 are removed. In another embodiment, they can be kept on the substrate 300. Then, a gate dielectric layer 318 is formed on the substrate 300 to cover the fin structure 312' and the sub spacer 315'. Then, a gate layer (not shown) is formed on the gate dielectric layer 318. The gate layer is then patterned so that the gate layer becomes a required gate 320 structure. Finally, an ion implant process is performed to form a source region 322a and a drain region 322b in the fin structure 312, as shown in FIG. 15. Through the above steps, a non-planar FET 324' is formed in the active region 400. In another embodiment, an inter-layer dielectric (ILD) layer (not shown) can be further formed on the non-planar FET 324', and a plurality of contact holes (not shown) is formed therein to provide an appropriate input/output pathway toward outer circuits.

As shown in FIG. 15, the non-planer FET 324' in the present embodiment includes a substrate 300, a fin structure 312, a sub spacer 315', a gate 320, a dielectric layer 318, and a source/drain region 322a and 322b. The sub spacer 315' is disposed at the middle portion of the fin structure such that the sub spacer 315' stretches outwardly from the fin structure 312 to form a wing-like structure. In one embodiment, the portion of the fin structure 312 above the sub spacer 315' has a height h1 comprised between 200 angstroms to 300 angstroms and the STI 316 bottom is lower than the sub spacer 315'.

In summary, the present invention provides a novel non-planar FET and the method of forming the same. It is one salient feature that a sub spacer is formed only on the middle sidewall of the fin structure. In one embodiment, the sub spacer is formed in the concave portion of the fin structure. In another embodiment, the sub spacer stretches outwardly from the fin structure to form a wing-like structure. Compared to conventional methods, the position of the sub spacer in the present invention can be well controlled, so the channel length of the non-planar FET in the present invention can also be ensured, thereby improving the performances of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a non-planar FET, comprising:
    providing a substrate;
    forming a plurality of fin structures, a plurality of shallow trench isolations (STIs) encompassing the fin structures and a plurality of sub spacers disposed only at a middle sidewall of the fin structure, wherein the STIs are completely lower than the sub spacers;
    forming a gate on the fin structure; and
    forming a source/drain region in the fin structure.

2. The method of forming the non-planar FET in claim 1, wherein the step of forming the fin structure and the sub spacer comprises:
    forming the fin structures, wherein each fin structure has a calabash-like structure; and
    forming the sub spacer filling into a concave portion of the calabash-like fin structure.

3. The method of forming the non-planar FET in claim 2, wherein the step of forming the calabash-like fin structures comprises a plurality of etching processes.

4. The method of forming the non-planar FET in claim 3, wherein the etching processes comprise:
    a first etching process to form a plurality of first trenches;
    a second etching process to form a plurality of the second trenches and the concave portions of the fin structure; and
    a third etching process to deepen the second trenches to form a plurality of third trenches.

5. The method of forming the non-planar FET in claim 4, wherein the first trench has a depth comprised between 200 angstroms to 300 angstroms.

6. The method of forming the non-planar FET in claim 4, wherein the third trench has a depth comprised between 2000 angstroms to 3000 angstroms.

7. The method of forming the non-planar FET in claim 2, wherein the step of forming the sub spacer comprises:
    forming a material layer on the substrate; and
    removing the material layer outside the concave portion of the fin structure.

8. The method of forming the non-planar FET in claim 1, wherein a material of the STIs has an etching selectivity with respect to that of the sub spacer.

9. The method of forming the non-planar FET in claim 1, wherein the step of forming the fin structure and the sub spacer comprises:
    forming the fin structures;
    forming a material layer conformally on the fin structure and the STIs; and
    performing an etching process to form the sub spacers.

10. The method of forming the non-planar FET in claim 9, wherein a material of the STIs has an etching selectivity with respect to that of the sub spacer.

* * * * *